United States Patent [19]

O'Connor

[11] Patent Number: 4,506,213

[45] Date of Patent: Mar. 19, 1985

[54] ELECTRONIC DEVICE HANDLER

[75] Inventor: Bruce O'Connor, San Diego, Calif.

[73] Assignee: Sym-Tek Systems, Inc., San Diego, Calif.

[21] Appl. No.: 514,489

[22] Filed: Jul. 18, 1983

[51] Int. Cl.³ ............................................ G01R 31/02
[52] U.S. Cl. ............................. 324/73 AT; 324/158 F
[58] Field of Search .......... 324/158 F, 158 R, 73 AT, 324/73 R; 29/593, 741; 209/571, 573

[56] References Cited

U.S. PATENT DOCUMENTS 3,716,786  2/1973  Gearin ........................... 324/73 AT
4,128,174 12/1978  Frisbie et al. ......................... 29/593
4,234,418 11/1980  Boissicat ............................... 29/741

Primary Examiner—Ernest F. Karlsen
Attorney, Agent, or Firm—Thomas J. Tighe

[57] ABSTRACT

A plurality of shuttle means receive untested devices from a feed track and position the devices in electrical contact with a contactor for testing. The shuttle means also discard tested devices via an exit track. Each shuttle means has a test track and a by-pass track. When all the shuttle means are in a load position, each track acts as a segment in a continuous track between the feed track and the exit track. When all the shuttle means are in a test position, each by-pass track acts as a segment in a continuous track between the feed track and the exit track. As long as each shuttle is either in its load position or test position, there is a continuous track between the feed track and the exit track, the segments of the track comprising either by-pass tracks, test tracks or any combination thereof. Defective devices can be pulled from test and discarded while others are undergoing testing.

12 Claims, 9 Drawing Figures

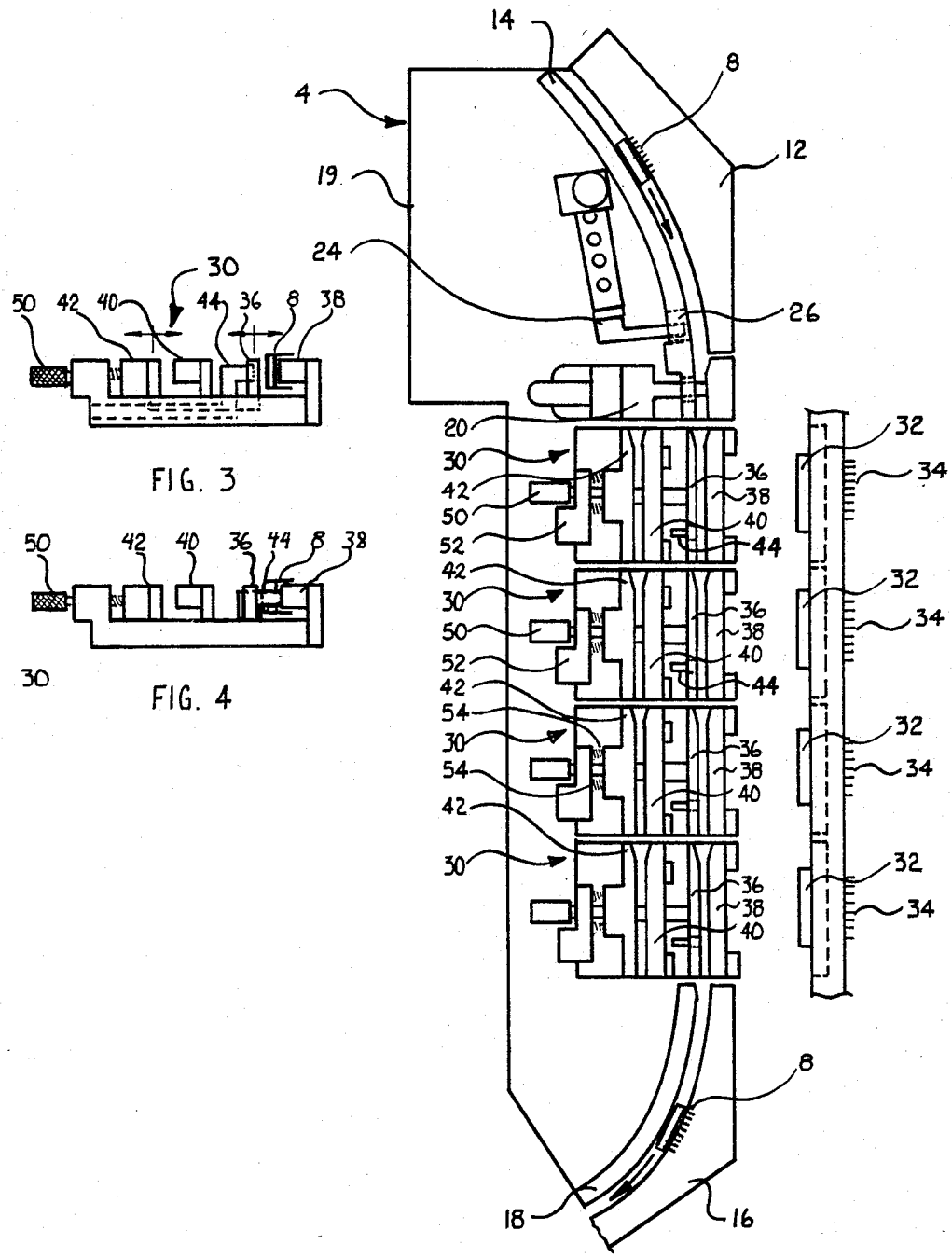

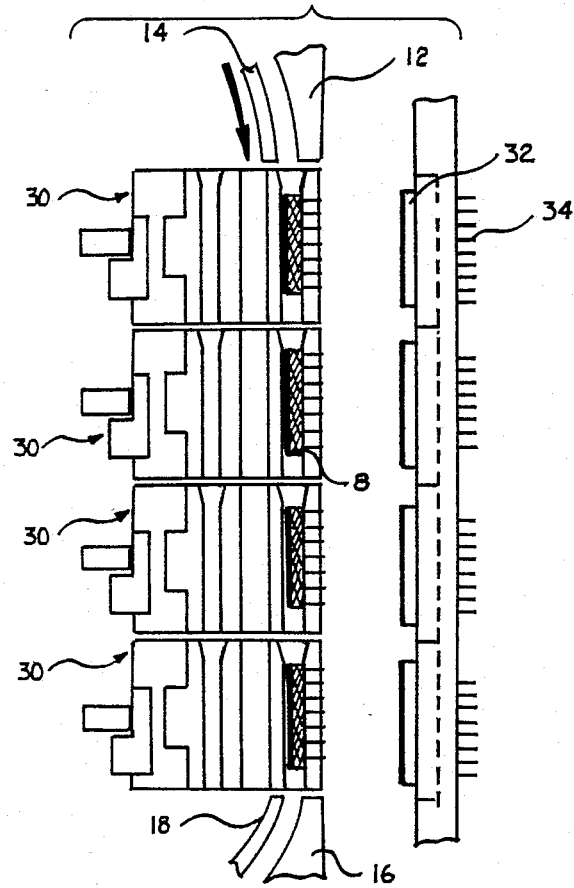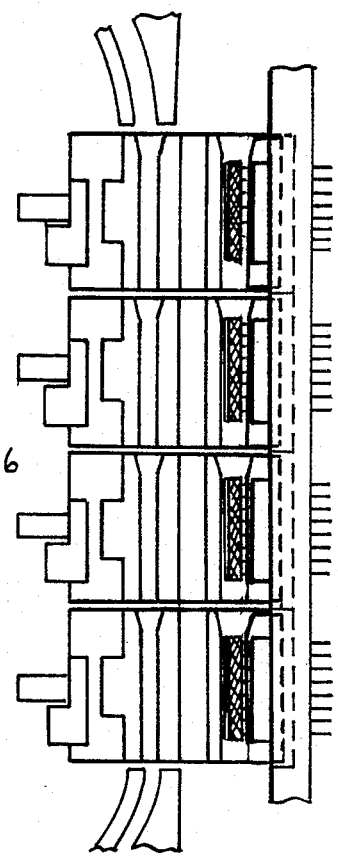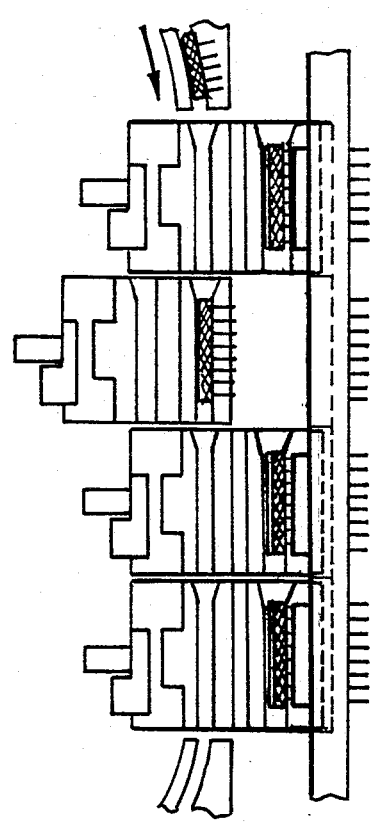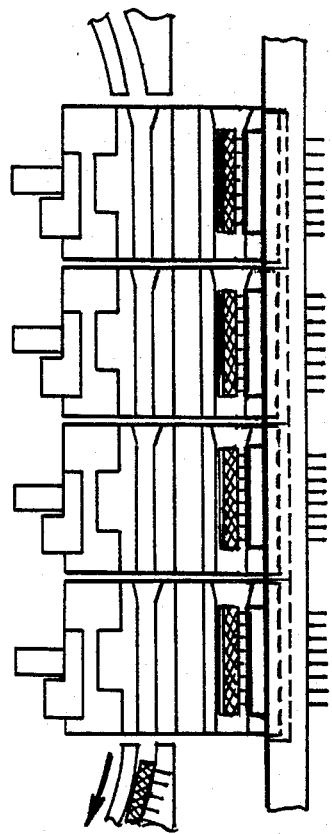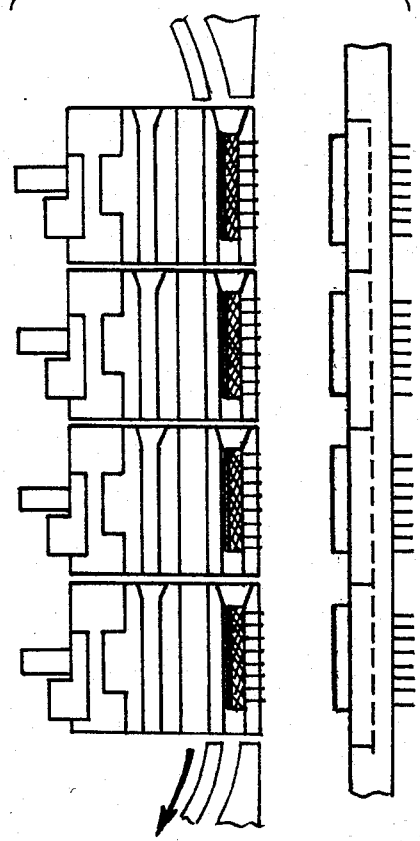

ELECTRONIC DEVICE HANDLER

BACKGROUND OF THE INVENTION

This invention relates generally to apparatuses for physically placing electronic devices in position for being tested by electronic testing equipment, and more specifically to apparatuses commonly known as handlers.

In this specification, the terms "electronic devices" and "devices" shall include all manufactured items capable of being tested by electronic means through a contactor, such as integrated circuits, transistors, diodes, hybird circuits, and the like. As used in this specification, a "handler" includes any apparatus that physically places one or more electronic devices in position for testing by electronic testing equipment to which the handler is interfaced. The interface between the electronic testing equipment and any electronic devices in position for testing is through one or more contactors.

Electronic devices are normally manufactured to specifications which set forth their parametric and functional characteristics over a range of temperatures. In order to insure that the devices meet the specification, they must be tested electronically. Testing is done by either selecting random samples from lots or by testing 100% of each lot.

In the past 10 years, electronic devices particularily integrated circuits have become extremely complex. For instance in the last 7 years memory devices have gone from less than 1000 bytes per device to over 64,000 bytes per device. Such complexity has required very thorough testing. In order to have a reliable product, some manufacturers, as a rule, test 100% of their more complex devices.

The proliferation of computers and computer peripherals in recent years has significantly increased the demand for electronic devices. In order to meet this demand, more devices must be manufactured and more devices must be tested. Thus, the increased complexity of the electronic devices, the need for reliability, and the increased demand for electronic devices have placed a heavy burden on those responsible for testing the devices.

Handlers were developed to aid in the testing of the electronic devices. A well designed handler usually comprises five major components. Electronic devices are usually transported in carriers such as tubes, so the first component is a means of moving the devices from the tubes and dispersing the devices into the second component of the handler, an environmental of thermal storage chamber. The storage chamber conditions the devices to an elevated temperature, typically 125°, or to a depressed temperature, typically −55°. From the storage chamber the devices are singularized and moved to the third component of the handler, a mechanism which plugs the device into a contactor for testing. After the device is tested, the device moves to the fourth component of the handler, a category sorter which sorts the devices into categorized compartments according to the test results. The fifth component of the handler is, of course, the control circuitry and the means by which the handler interfaces to the operator.

A contactor is a device that has electrical leads that close and open upon the leads of the device under test. During the time the leads are closed, the electronic test equipment is usually performing a variety of electrical tests.

Heretofore, most handlers had only the capability of presenting one device for testing at a time. Such handlers were capable of handling the volume of devices as long as the test time for a device was on the order of 200 milliseconds. As "dynamic random access memory" devices became popular (for instance the 16K RAM) the throughput of the handlers was significantly reduced because test times became very long (approximately 10–20 seconds as compared to 200 milliseconds for a common device). To increase the throughput, dual handlers were introduced. The dual handlers typically feed two devices from the storage into a mechanism which plugs the two devices into two contactors. The two devices are tested and then exited by means of a single exit track. The dual handler, however, has the disadvantage of having one device positioned above the other device in a single track system. If the upper device in a single track has failed, it cannot be sorted past the lower device in the track. Thus, a bad device that is detected early in testing, cannot be replaced by an untested device until the device below it has completed its test.

Some manufacturers have introduced systems whereby two tracks and four contactors are used but such systems have the same disadvantage as dual systems in that a bad device cannot circumvent the other devices being tested.

This invention presents a single track system, that is, a single track feeds the devices from the storage into the mechanism which plugs the devices into the contactors, and a single track receives the devices from the mechanism and disperses them into the catagory sorter. However, in this invention, a plurality of devices may be tested in parallel and, during testing each device can be sorted and replaced independent of the others. With this invention, a plurality of devices may be tested in stages. All devices can be run through a quick test to determine if they meet certain specifications and, if any fail, they can be rejected and replaced with new devices without disturbing the devices which passed the initial test. Thus, while some devices are being rejected, others can be undergoing testing. Such a system has heretofore not been presented.

Other advantages and attributes of this invention will become readily apparent upon a reading of the text hereinafter.

SUMMARY

This invention presents an escapement mechanism for use in a handler by which a plurality of electronic devices can be presented for parallel testing. It is comprised of a means for singularizing the plurality of devices and propelling, preferably by gravity, a single device along a single feed track, an exit track for receiving each device after it has been tested, a plurality of shuttle means interposed between the feed track and the exit track and juxtaposed with respect to each other, a plurality of contactors, one associated with each shuttle means, and a means for propelling, preferably by gravity, devices from the escapement mechanism along the exit track. Each shuttle means moves in reciprocal motion such that each shuttle means has at least a test postion and a load position. A test track is affixed to each shuttle means and disposed thereon such that when all the shuttle means are in the load position each test track acts as a segment in an continuous track between the feed track and the exit track. A by-pass track is affixed to each shuttle means and disposed thereon such that when all the shuttle means are in the test position each by-pass track acts as a segment in a continuous track between the feed track and the exit track. Each test track has a releasable stop means associated therewith for stopping the movement of a device at a suitable position along the track. Each contactor is adapted to make electrical contact with the device disposed on the test track of the associated shuttle means when said shuttle means is in its test position.

A method of utilizing the above described escapement mechanism to more efficiently test devices is also presented. Initially all shuttle means are in their load position and one device is loaded onto the test track of each of the shuttle means. All the shuttle means are then moved to their test positions bringing the devices into electrical contact with the contactors. A short parametric test is run on each device. If the parametric test results indicate one or more defective devices, all the shuttle means bearing defective devices are moved to their load positions while the others remain in their test positions. The defective devices are unloaded and sent down the exit track. New devices are then loaded into recently unloaded shuttle means which are then returned to their test positions. A parametric test is conducted on all the devices which have not undergone the test and previous steps are repeated until all shuttle means are in their test positions bearing devices which have successfully completed the parametric testing. They are all then give a lengthy functional test and unloaded via the exit track.

BRIEF DESCRIPTION OF THE DRAWINGS

FIG. 2 is a plane view of the escapement mechanism.

FIG. 3 is a sideview of a shuttle means, stop means released.

FIG. 4 is a sideview of a shuttle means, stop means engaged.

FIG. 5 is a plane view of four shuttle means in their loading position.

FIG. 6 is a plane view of the shuttle means in their test position.

FIG. 7 is a plane view of the shuttles wherein three are in their test position and one is in its load position.

FIG. 8 is a plane view of the shuttle means in their test position.

FIG. 9 is a plane view of the shuttle means in their load position.

DESCRIPTION OF THE PREFERRED EMBODIMENT

Figure 1:
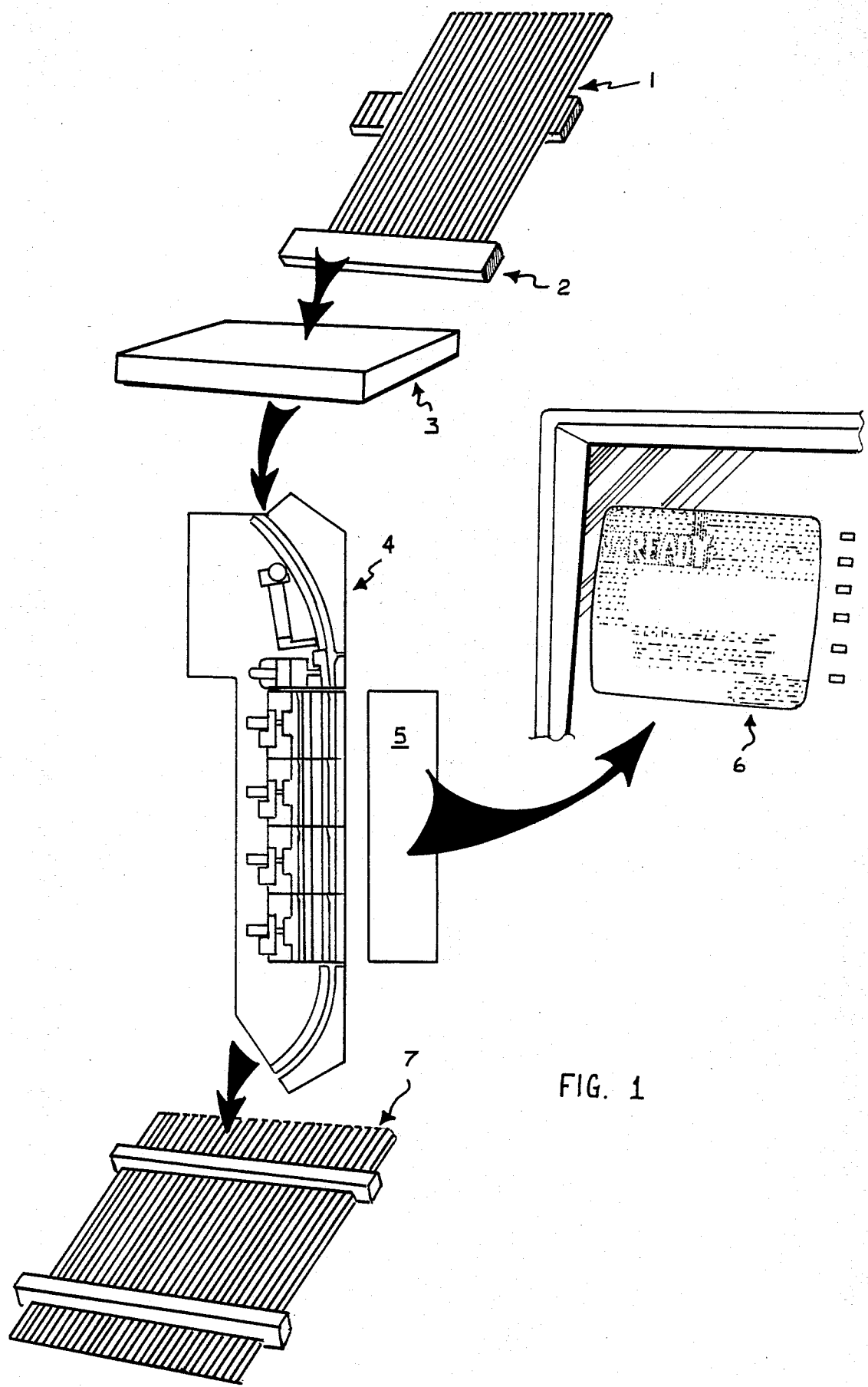
FIG. 1 is a diagrammatical depiction of the invention and how it relates to the handler.

Referring to FIG. 1, plastic tubes or sleeves 1 bearing electronic devices feed those devices to an input belt 2 similar to a conveyor belt. The belt 2, in turn feeds devices to a storage 3. The storage 3 is a thermal storage and either elevates or depresses the temperature of the devices. When the devices have reached the desired temperature, they are then transferred to the escapement mechanism 4 which is the subject of this application. The escapement mechanism 4 presents the devices for testing by the test equipment 5. Typically, the handler and/or the test equipment 5 are computer controlled and interfaced with an operator via a CRT display 6. Following testing, the devices are routed from the escapement mechanism 4 to a category sorter 7 which deposits the devices into tubes or bins according to test results.

As used in this specification, the term "track" is defined as being any means of physically guiding an object along a predetermined path, including, but not limited to rails, channels and the like. For purposes of discussion and illustration only, a particular type of electronic device is arbitrarily chosen. The type chosen is an integrated circuit packaged in a dual-in-line package (DIP).

Referring to FIGS. 2 through 4, an escapement mechanism generally designated 4 is shown having a feed track comprising a feed track rail 12 and a feed track guide 14 between which a DIP 8 is propelled, preferably by gravity, with the leads of the DIP 8 straddling the feed track rail 12. A DIP exits the escapement mechanism via an exit track comprising an exit track rail 16 and an exit track guide 18, the DIP passing between said rail and track with its leads straddling said rail. Preferably, the feed gtrack and the exit track are affixed to a base plate 19.

DIPs coming into the mechanism 4 via the feed track are not typically singularized. A singularizing means is shown to comprise a blocking means 20 and a holding means 24. The blocking means 20 has a tab at one end which reciprocally moves through a slot 22 defined by feed track guide 14. At a first extent of movement, the blocking means blocks the feed track by abutting the tab against the feed track rail 12, and at a second extent, the blocking means tab portion is clear of the gap between the feed track guide and feed track rail. Thus, when the blocking means is in its first extent, it blocks the feed track and prevents movement of the DIPs along the track, and in its second extent the blocking means permits unhindered progression of DIPs along the feed track. The holding means 24 is adapted to press a DIP firmly against the feed track rail 12 and thereby prevent progression of devices along the feed track. To accomplish this, a tubular portion of the holding means reciprocally moves through a slot 26 defined by the feed track guide 14. At a first extent, the tabular portion of the holding means is abutted and pressed agaist a DIP, and at a second extent the tabular portion is clear of the gap between the feed track guide and the feed track rail. The spacing between the blocking means and the holding means is set such that, as the blocking means blocks progression of a plurality of DIPs along the feed track, the tubular portion of the holding means aligns with the median of the DIP adjacent to the DIP abutting the blocking means.

Initially, the blocking means is in the track blocking position. A plurality of DIPs are propelled along the feed track and are stopped by the blocking means. To singularize a DIP, the holding means is engaged to press against the next-in-line DIP, that is, the DIP adjacent to the DIP abutted against the blocking means. When the holding means has securely pressed the next-in-line DIP against the feed track rail, thereby preventing progression along the feed track, the blocking means releases the first-in-line DIP. The blocking means then resumes the blocking position and the holding means releases the next-in-line DIP which then becomes the first-in-line DIP. Thereafter DIPs are singularized in identical fashion.

Referring again to FIGS. 2 through 4, interposed between the feed track and the exit track and juxtaposed with respect to each other, are a plurality of shuttle means, each generally designated 30. Each shuttle means moves in reciprocal motion independent of the other shuttle means such that each shuttle means has at least a test position and a load position. In its load position, each shuttle means 30 is in a position to receive a DIP for testing or to release a DIP to the exit track at the conclusion of testing. In its test position each shuttle means which has received a DIP for testing is in a position which places the leads of the DIP in electrical contact with a contactor 32. Thus, there are a plurality of contactors, one associated with each shuttle means. The leads 34 of each contactor are adapted to be placed in electrical communication with the testing equipment 5.

Not shown and are the means for moving the shuttle means in independent reciprocal motion across base plate 19.

Affixed to each shuttle means is a test track preferably comprising a test rail 36 and a test guide 38. Each test track is disposed upon its respective shuttle means such that when all the shuttle means are in the load position each test track acts as a segment in a continuous track between the feed track and the exit track. FIG. 2 represents a situation where all the shuttle means 30 are in their load position and, it can be seen, that there is a continuous DIP path from the feed track through the shuttle means to the exit track.

Affixed to each shuttle means is a by-pass track preferably comprised of a by-pass rail 40 and a by-pass guide 42. Each by-pass track is disposed upon its respective shuttle means such that when all the shuttle means are in the test position each by-pass track acts a segment in a continuous track between the feed track and the exit track. Thus, if all of the shuttle means in FIG. 2 were moved to the right to their test positions, there would be a continuous DIP path from the feed track through to the exit track 30.

Referring again to FIGS. 2 through 4, a stop means 44 is disposed upon each shuttle means. Each stop means 44 is an elongated member forming an inverted "L" shaped tab at one end. Each stop means 44 moves reciprocally in relation to the shuttle means such that it has a blocking position and a releasing position. In the blocking position, the tab of the stop means blocks progression of a DIP along the test track of its respective shuttle means, thus holding the DIP in position for testing. In its release position, the stop means permits unimpeded progression of DIPs along the test track. Preferably, the tab portion of the stop means 44 gains access to the test track via a slot defined by the test guide 38. Not shown are the means by which the stop means are moved.

Referring to FIG. 5, four shuttle means are shown in their load position. Four DIPs, one each, have been loaded into the four shuttle means. The loading process is as follows: (1) the lowest shuttle stop means is moved to block the gap between its test guide and rail; (2) a single DIP is released by the blocking means 20; (3) the DIP falls through the higher shuttles and comes to rest upon the stop means of the lowest shuttle; (4) the second lowest shuttle stop means is then moved to block the gap between its test guide and rail; (5) a second DIP is released by the blocking means; (6) the second DIP falls through the higher shuttles and comes to rest upon the stop means of the second to lowest shuttle; (7) the other shuttles are loaded in similar fashion.

Referring to FIG. 6, four shuttles are shown in their test position, that is, they have been moved forward from their load position to a point where the DIPs are in electrical contact with the contactors. The DIPs are pressed into contact by their respective test guides.

FIG. 7 represents a situation where a preliminary test has been performed upon the DIPs and the DIP in the shuttle which is second from the top was found to be defective, and that particular shuttle has been moved from its test position to its load position while the others remain in their test position. At this point, the stop means of the shuttle bearing the defective DIP is pulled back allowing the defective DIP to fall through the lower shuttles via their by-pass tracks and into the exit track. After the defective DIP is released, the stop means of that same shuttle then moves to block the gap between its test guide and test rail, thus enabling the shuttle to receive a replacement DIP which is then released by the blocking means 20.

FIG. 8 represents a situation where one or more defective DIPs have been discarded and replaced by untested DIPs, and all shuttles are in their test positions.

FIG. 9 represents a situation where all testing has been completed and the DIPs are about to be unloaded from the shuttle. The method of unloading is as follows: (1) the stop means of the lowest shuttle is pulled back allowing the DIP in that shuttle to fall toward the exit track; (2) the stop means of the second to lowest shuttle is then pulled back allowing the DIP in that shuttle to fall through the lowest shuttle into the exit track; (3) the other DIPs are released in similar fashion. Having released the tested DIPs, the shuttles are ready and are in a position to receive untested DIPs.

To accommodate varying thickness of devices, it is desirable to be able to adjust the gap between the guides and the rails, both test and by-pass. A means for adjusting each can be provided, but preferably the rails 38 and 40 are fixed in position with respect to their shuttle means, and the guides 36 and 42 are linked together and adjustable in unison by means of a thumb wheel screw means 50. The thumb wheel screw means 50 is anchored in standoff 52. A pair of spring means 54 urge the linked guides 36 and 42 away from the standoff 52.

As mentioned before, the escapement mechanism is a means by which a plurality of devices can be presented in parallel for testing, and while the presentation of some devices is maintained, other devices which have been found to be defective by preliminary tests can be removed from presentation and ejected via the exit track. This makes possible the method of testing in steps. The plurality of devices can be presented for testing and preliminarily tested. If any of the devices are found by the preliminary testing to be defective, those defective devices can be removed from presentation and replaced by untested devices. The untested devices can be preliminarily tested and defective ones replaced again. After all the devices which are presented for testing have been found not to be defective by the preliminary testing, they can then be comprehensively tested.

With respect to many electronic devices, the preliminary testing can be a type of parametric testing and the comprehensive testing can be a more time consuming functional testing of the devices.

In more specific terms concerning the above-described method of testing, the devices are presented when they are loaded, one each, into the test tracks of the shuttle means and the shuttle means are all moved to their test positions. Removing some defective devices from presentation is accomplished by moving the shuttle means bearing the defective devices to their load positions and unloading the defective devices via the exit track. Those shuttles are then reloaded with untested devices and moved back to their test position. Such a method of testing is very advantageous in that defects which are typically fatal to a device can be detected early in testing without consuming much time, and the more time consuming functional tests can be conducted only on those devices which do not have the early detectable fatal defects. Thus, the average test time per device is reduced considerably.

The foregoing description was given for illustrative purposes only and no unnecessary limitations in the following claims should be drawn therefrom.

I claim:

1. In a handler a mechanism for presenting in parallel a plurality of devices for testing comprising:
   (a) a feeding means adapted to provide a plurality of devices, one at a time,
   (b) an exit means for receiving each device after it has been tested,
   (c) a plurality of shuttle means interposed between the feed means and the exit means, each shuttle means being adapted to individual reciprocal movement between at least a test position and a load position,
   (d) a test track affixed to each shuttle means and disposed thereon such that, when each shuttle means is in its load position, its test track is a segment of a continuous track between and in communication with the feed means and the exit means,
   (e) a by-pass track affixed to each shuttle means and disposed thereon such that, when each shuttle means is in its test position, its by-pass track is a segment of said continuous track, the continuous track existing whenever all of the shuttle means are in either their test or load positions, the continuous track comprising at least any combination of test tracks and by-pass tracks,
   (f) a plurality of contactors, one associated with each shuttle means, each contactor being adapted to make electrical contact with a device on the test track of an associated shuttle means when said shuttle means is in its test position,
   (g) a plurality of individually actuated, releasable stop means, one associated with each test track, and each operable to stop movement of a device at a suitable position along an associated test track, and
   (h) a means of urging the devices from the feed means and along the continuous track in the direction of the exit means.

2. The mechanism of claim 1 wherein the feed means comprises:
   (a) a feed track along which a plurality of devices traverse in a single line,
   (b) a blocking means adapted to releasably hold a device in place in the feed track,
   (c) a holding means adapted to releasably hold in place a device which follows in line and is adjacent to the device held by the blocking means, and
   (d) a control means operable to repeatedly actuate and release the blocking means and the holding means in suitable order.

3. The mechanism of claim 1 wherein each test track is a channel defined by a rail and a spaced apart guide means.

4. The mechanism of claim 1 wherein each by-pass track is a channel defined by a rail and spaced apart guide means.

5. The mechanism of claim 3 wherein the space between the guide means and rail is adjustable.

6. The mechanism of claim 4 wherein the spaced between the guide means and the rail is adjustable.

7. The mechanism of claim 1 wherein each test track and each by-pass track is a channel defined by a rail and a spaced apart guide means.

8. The mechanism of claim 7 wherein the test track and the by-pass spaces are adjustable in unison.

9. The mechanism of claim 3 wherein the devices under test have at least a pair of spaced apart electrical leads, and the rails are so adapted that the leads straddle said rails.

10. The mechanism of claim 4 wherein the devices under test have at least a pair of spaced apart electrical leads, and the rails are so adapted that the leads straddle said rails.

11. The mechanism of claim 1 wherein the urging means is natural gravity.

12. In a handler interfaced to equipment adapted to test a plurality of devices preliminarily before conducting more comprehensive tests, and having a mechanism for presenting the plurality of devices for testing comprising a feed means adapted to provide a plurality of devices, one at a time, an exit means for receiving each device after it has been tested, a plurality of shuttle means interposed between the feed means and exit means, each shuttle means being adapted to individual reciprocal movement between at least a test position and load position, a test track affixed to each shuttle means and disposed thereon such that, when each shuttle means is in its load position, its test track is a segment of a continuous track between and in communication with the feed means and the exit means, a by-pass track affixed to each shuttle means and disposed thereon such that when each shuttle means is in its test position, its by-pass track is a segment of said continuous track, the continuous track existing whenever all of the shuttle means are in either their test or load positions, the continuous track comprising at least any combination of test tracks and by-pass tracks, a plurality of contactors, one associated with each shuttle means, each contactor being adapted to make electrical contact with a device on the test track of an associated shuttle means when said shuttle means is in its test position, a plurality of individually actuated, releasable stop means, one associated with each test track, and each operable to stop movement of a device at a suitable position along the associated test track, and a means of urging the devices along the continuous track in the direction of the exit means, the method of testing said devices comprising these steps:
   (a) while all shuttle means are in their load positions, loading each test track with one device to be tested,
   (b) moving all shuttle means to their test positions,
   (c) preliminarily testing all loaded devices,
   (d) if any devices are found by the preliminary testing to be defective, moving all shuttle means bearing defective devices to their load positions while leaving the others in their test positions,
   (e) unloading the defective devices via the exit means,
   (f) reloading all shuttle means which are without devices,
   (g) returning the reloaded shuttle means to their test positions,
   (h) preliminarily testing all devices that have not been so tested, (i) repeating steps, (d) through (h) until all shuttle means are in their test positions bearing devices which have been found not to be defective by preliminary testing, (j) comprehensively testing all loaded devices,
(k) moving all shuttle means to their load positions, and
(l) unloading all devices via the exit means.

* * * * *